(12) United States Patent
Krattiger

(10) Patent No.: US 10,966,297 B2
(45) Date of Patent: Mar. 30, 2021

(54) SYSTEM AND METHOD FOR MULTI-SLOPE CONTROL OF LIGHTING INTENSITY

(71) Applicant: ERP POWER, LLC, Moorpark, CA (US)

(72) Inventor: Steven C. Krattiger, Northridge, CA (US)

(73) Assignee: ERP POWER, LLC, Moorpark, CA (US)

( * ) Notice: Subject to any disclaimer, the term of this patent is extended or adjusted under 35 U.S.C. 154(b) by 0 days.

(21) Appl. No.: 16/905,501

(22) Filed: Jun. 18, 2020

(65) Prior Publication Data

US 2020/0413512 A1 Dec. 31, 2020

Related U.S. Application Data

(60) Provisional application No. 62/867,056, filed on Jun. 26, 2019.

(51) Int. Cl.
| | |
|---|---|
| *H05B 45/10* | (2020.01) |
| *H05B 45/325* | (2020.01) |
| *H05B 45/37* | (2020.01) |
| *H03K 5/12* | (2006.01) |
| *H03K 5/24* | (2006.01) |
| *H05B 47/14* | (2020.01) |

(52) U.S. Cl.
CPC ............ *H05B 45/325* (2020.01); *H03K 5/12* (2013.01); *H03K 5/24* (2013.01); *H05B 45/10* (2020.01); *H05B 45/37* (2020.01); *H05B 47/14* (2020.01)

(58) Field of Classification Search
CPC ........ H05B 45/10; H05B 45/14; H05B 45/32; H05B 45/325; H05B 45/327; H05B 45/37; H05B 47/10; H05B 47/105; H05B 47/14; H05K 5/12; H05K 5/24
See application file for complete search history.

(56) References Cited

U.S. PATENT DOCUMENTS

| | | | | |
|---|---|---|---|---|
| 5,604,411 | A * | 2/1997 | Venkitasubrahmanian | ................. H05B 41/3924 315/307 |
| 8,552,662 | B2 * | 10/2013 | Sun | ...................... H05B 45/382 315/294 |
| 2011/0175543 | A1 * | 7/2011 | Sun | ........................ H05B 45/37 315/291 |

* cited by examiner

*Primary Examiner* — Long Nguyen
(74) *Attorney, Agent, or Firm* — Lewis Roca Rothgerber Christie LLP

(57) ABSTRACT

A method of controlling a power supply electrically coupled to a dimmer and a light source includes receiving a plurality of sample values corresponding to dimmer levels, comparing a sample value of the plurality of sample values with one or more inflection points, the one or more inflection points being associated with a plurality of slew-rates, identifying a particular slew-rate among the plurality of slew-rates based on the comparison, and generating a control signal based on the particular slew-rate for transmission to the power supply.

21 Claims, 7 Drawing Sheets

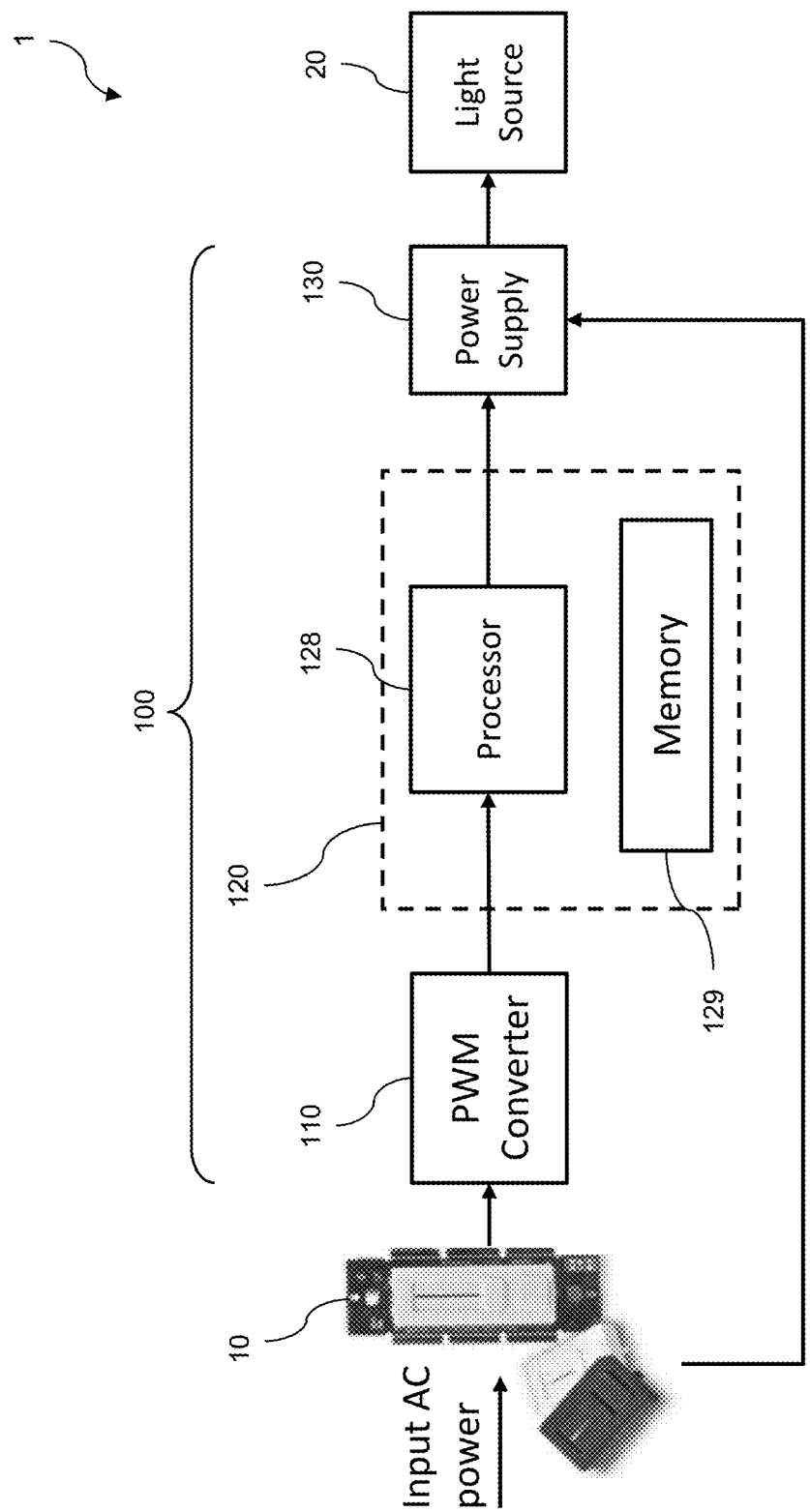

SYSTEM AND METHOD FOR MULTI-SLOPE CONTROL OF LIGHTING INTENSITY

CROSS-REFERENCE TO RELATED APPLICATION(S)

This application claims priority to, and the benefit of, U.S. Provisional Application No. 62/867,056 ("MULTI-SLOPE TRIAC CONTROL OF LIGHTING INTENSITY"), filed on Jun. 26, 2019, the entire content of which is incorporated herein by reference.

The present application is also related to U.S. Patent Application entitled "MULTI-INPUT POWER SUPPLY SYSTEM AND METHOD OF USING THE SAME" Application No. 16/905,421, filed Jun. 18,2020, which claims priority to and the benefit of U.S. Provisional Application No. 62/867,052 ("TRIAC DETECTION SOFTWARE"), filed on Jun. 26, 2019, the entire content of which is incorporated herein by reference.

The present application is also related to U.S. Patent Application entitled "HIGH PERFORMANCE DIMMING BASED ON DIMMER SLEW-RATE" Application No. 16/905,407, filed Jun. 18,2020, which claims priority to and the benefit of U.S. Provisional Application No. 62/867,027 ("HIGH PERFORMANCE DIMMING BASED ON DIMMER SLEW-RATE"), filed on Jun. 26, 2019, the entire content of which is incorporated herein by reference.

The present application is also related to U.S. Patent Application entitled "SYSTEM AND METHOD FOR INVALID PULSE REJECTION" Application No. 16/905,461, filed Jun. 18,2020, which claims priority to and the benefit of U.S. Provisional Application No. 62/866,371 ("MISSING PULSE CORRECTION FOR PROGRAMMABLE TRIAC CONTROL DRIVERS"), filed on Jun. 25, 2019, the entire content of which is incorporated herein by reference.

The present application is also related to U.S. Patent Application entitled "DYNAMIC FILTERING FOR SMOOTH DIMMING OF LIGHTS" Application No. 16/905,438, filed Jun. 18,2020, which claims priority to and the benefit of U.S. Provisional Application No. 62/866,392 ("UTILIZING DYNAMIC FILTERING FOR SMOOTH DIMMING OF LIGHTS"), filed on Jun. 25, 2019, the entire content of which is incorporated herein by reference.

The present application is also related to U.S. Patent Application entitled "MOVEMENT-BASED DYNAMIC FILTERING FOR SMOOTH DIMMING OF LIGHTS" Application No. 16/905,516, filed Jun. 18,2020, which claims priority to and the benefit of U.S. Provisional Application No. 62/866,392 ("UTILIZING DYNAMIC FILTERING FOR SMOOTH DIMMING OF LIGHTS"), filed on Jun. 25, 2019, the entire content of which is incorporated herein by reference.

FIELD

Aspects of the present disclosure are related to a power supply for lighting systems and a method of operating the same.

BACKGROUND

Recently there has been increasing demand for High-Performance dimmers that do not incorporate slow response dimming. What is desired is an immediate tracking of the dimmer input to power-supply output without the nagging delay and filtering built into most supplies today.

The above information disclosed in this Background section is only for enhancement of understanding of the disclosure, and therefore it may contain information that does not form the prior art that is already known to a person of ordinary skill in the art.

SUMMARY

Aspects of embodiments of the present disclosure are directed to a multi-slope power supply capable of reducing or eliminating overshoot, undershoot, ringing, and other undesirable voltage and current swings when dimming High-Performance drivers with phase-cut Triac dimmers.

Aspects of embodiments of the present disclosure solve an overshoot issue encountered when driving Power Factor Corrected (PFC) power-supplies in high-performance mode when phase-cut dimmers are used for control. Embodiments of the present disclosure allow for the use of a dual-slope, or multi-slope target to achieve fast power supply transitions without overshoot or undershoot, thus significantly reducing or eliminating flickering and flashing during fast transitions from dimmer inputs.

According to some embodiments of the present disclosure, there is provided a method of controlling a power supply electrically coupled to a dimmer and a light source, the method including: receiving a plurality of sample values corresponding to dimmer levels; comparing a sample value of the plurality of sample values with one or more inflection points, the one or more inflection points being associated with a plurality of slew-rates; identifying a particular slew-rate among the plurality of slew-rates based on the comparison; and generating a control signal based on the particular slew-rate for transmission to the power supply.

In some embodiments, the method further includes: determining a movement direction of the dimmer based on the plurality of sample values, wherein the comparing the sample value with the one or more inflection points is based on the movement direction of the dimmer.

In some embodiments, the one or more inflection points include a first upward inflection point, the plurality of slew-rates includes a first upward slew-rate and a second upward slew-rate, the comparing the sample value with the one or more inflection points includes: determining that the sample value is less than the first upward inflection point, and wherein the identifying the particular slew-rate among the plurality of slew-rates includes: identifying the first upward slew-rate as the particular slew-rate.

In some embodiments, the comparing the sample value with the one or more inflection points includes: determining that the sample value is greater than or equal to the first upward inflection point, and the identifying the particular slew-rate among the plurality of slew-rates includes: identifying the second upward slew-rate as the particular slew-rate.

In some embodiments, the first upward slew-rate is greater than the second upward slew-rate.

In some embodiments, the one or more inflection points further include a second upward inflection point greater than the first upward inflection point, the plurality of slew-rates further includes a third upward slew-rate, the comparing the sample value with the one or more inflection points includes determining that the sample value is greater than the second upward inflection point, and the identifying the particular slew-rate among the plurality of slew-rates includes identifying the third upward slew-rate as the particular slew-rate.

In some embodiments, the third upward slew-rate is less than the first and second upward slew-rates.

In some embodiments, the one or more inflection points include a first downward inflection point, wherein the plurality of slew-rates includes a first downward slew-rate and a second downward slew-rate, wherein the comparing the sample value with the one or more inflection points includes determining that the sample value is greater than the first downward inflection point, and wherein the identifying the particular slew-rate among the plurality of slew-rates includes identifying the first downward slew-rate as the particular slew-rate.

In some embodiments, the comparing the sample value with the one or more inflection points includes determining that the sample value is less than or equal to the first downward inflection point, and the identifying the particular slew-rate among the plurality of slew-rates includes identifying the second downward slew-rate as the particular slew-rate.

In some embodiments, the first downward slew-rate is more negative than the second downward slew-rate.

In some embodiments, the one or more inflection points further include a second downward inflection point less than the first downward inflection point, the plurality of slew-rates further includes a third downward slew-rate, the comparing the sample value with the one or more inflection points includes determining that the sample value is less than the second downward inflection point, and the identifying the particular slew-rate among the plurality of slew-rates includes identifying the third downward slew-rate as the particular slew-rate.

In some embodiments, the third downward slew-rate is greater than the first and second downward slew-rates.

In some embodiments, the power supply is configured to generate a drive signal having no overshoot or undershoot based on the control signal.

In some embodiments, the method further includes: receiving a modified AC input signal from the dimmer; and generating the plurality of sample values based on the modified AC input signal, the plurality of sample values including the sample value.

In some embodiments, the generating the plurality of sample values includes: converting the modified AC input signal into a pulse width modulation (PWM) signal; and sampling the PWM signal to generate the plurality of sample values, each of the plurality of sample values corresponding to a dimming level of the dimmer at a corresponding sample time.

According to some embodiments of the present disclosure, there is provided a power supply controller coupled to a power supply, the power supply controller including: a processor; and a processor memory local to the processor, wherein the processor memory has stored thereon instructions that, when executed by the processor, cause the processor to perform: receiving a plurality of sample values corresponding to dimmer levels; comparing a sample value of the plurality of sample values with one or more inflection points, the one or more inflection points being associated with a plurality of slew-rates; identifying a particular slew-rate among the plurality of slew-rates based on the comparison; and generating a control signal based on the particular slew-rate for transmission to the power supply.

In some embodiments, when executed by the processor, the instructions further cause the processor to perform: determining a movement direction of the dimmer levels based on the plurality of sample values, wherein the comparing the sample value with the one or more inflection points is based on the movement direction of the dimmer levels.

In some embodiments, the one or more inflection points include a first upward inflection point, the plurality of slew-rates includes a first upward slew-rate and a second upward slew-rate, the comparing the sample value with the one or more inflection points includes determining that the sample value is less than the first upward inflection point, and the identifying the particular slew-rate among the plurality of slew-rates includes identifying the first upward slew-rate as the particular slew-rate.

In some embodiments, the one or more inflection points include a first downward inflection point, the plurality of slew-rates includes a first downward slew-rate and a second downward slew-rate, the comparing the sample value with the one or more inflection points includes: determining that the sample value is greater than the first downward inflection point, and the identifying the particular slew-rate among the plurality of slew-rates includes: identifying the first downward slew-rate as the particular slew-rate.

BRIEF DESCRIPTION OF THE DRAWINGS

The accompanying drawings, together with the specification, illustrate example embodiments of the present disclosure, and, together with the description, serve to explain the principles of the present disclosure.

FIG. 3B illustrates the power supply controller implemented as a processor and memory, according to some embodiments of the present disclosure.

DETAILED DESCRIPTION

The detailed description set forth below is intended as a description of example embodiments of a multi-slope power supply for lighting systems and a method of operation of the same, provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the spirit and scope of the disclosure. As denoted elsewhere herein, like element numbers are intended to indicate like elements or features.

Recently there has been increasing demand for High-Performance dimmers that do not incorporate slow response dimming. Designing a power supply with rapid response to 100% setting changes where phase-cut Triac dimmers are used may be difficult, as processing the input can be very complex. The instantaneous changes in current can cause power supplies to flicker due to starvation of current from the primary side, while a processor is trying to smoothly control the output on the secondary side.

Also, power supplies tend to overshoot the maximum target and oscillate, causing flashes of light at the top dimmer settings or they bounce from undershoot and excess energy at the bottom dimmer settings.

Figure 1:
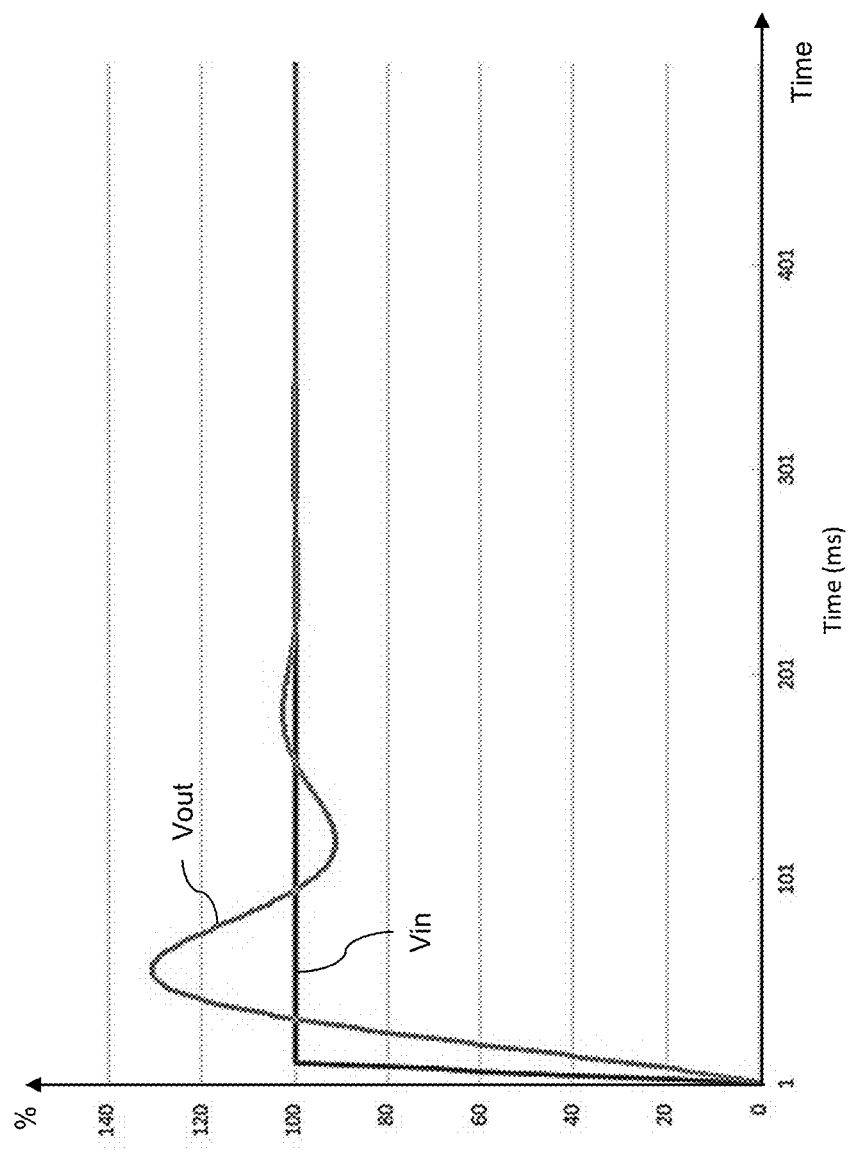
FIG. 1 illustrates a typical overshoot of a power supply output when encountering a rapid 100% change in dimmer input, according to some examples.

FIG. 1 illustrates a typical overshoot of a power supply output when encountering a rapid 100% change in dimmer input, according to some examples.

In FIG. 1, the curve Vin represents the dimmer level setting which changes from 0% to 100% very rapidly. The curve Vout represents the power supply output as the power supply attempts to keep up with the rapid change in dimmer level. FIG. 1 illustrates an example of 30% overshoot by the power supply output over the target setting of 100%, which would cause flickering of the light output and may take 200 mS to settle down to the target value, sometimes oscillating 3-5 times depending on the type of light being driven by the power supply. This same phenomenon may occur when the supply is dimmed down rapidly due to the excess of current in the primary of the power supply, which can cause an undershoot and bouncing, and results in multiple flashes of light when the dimmer is at a low setting. Even a 5% overshoot or undershoot can be noticed by the human eye, so it is desirable to eliminate this overshoot and undershoot by the power supply output.

The power supply system according to some embodiments of the present disclosure can significantly reduce or eliminate the aforementioned overshoots and undershoots under various loads and current levels by utilizing a multi-slope transition of the input for the power supply to follow.

Figure 2:
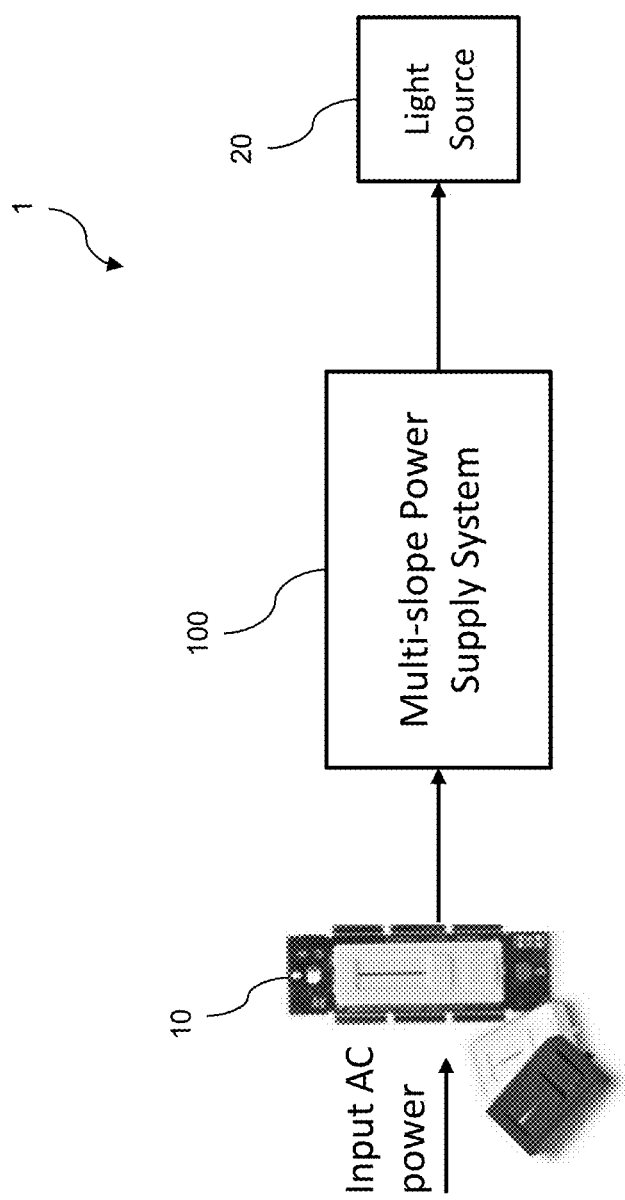
FIG. 2 is a block diagram of a lighting system utilizing the multi-slope power supply system, according to some embodiments of the present disclosure.

FIG. 2 is a block diagram of a lighting system 1 utilizing the multi-slope power supply system 100, according to some embodiments of the present disclosure.

Referring to FIG. 2, lighting system 1 includes a dimmer (e.g., a phase dimmer) 10, the power supply system (also referred to as a multi-slope power supply system or a power supply system with adaptive slew-rate) 100, and a light source 20. According to some examples, the dimmer interface may be a rocker interface, a tap interface, a slide interface, a rotary interface, or the like. A user may adjust the dimmer level by, for example, adjusting a position of a dimmer lever or a rotation of a rotary dimmer knob, or the like. The dimmer 10 receives an AC input signal (e.g., a 120 VAC signal from the wall) and modifies (e.g., cuts/chops a portion of) the AC input voltage sinewave signal according to the dimmer level before sending it to the power supply system 100, and thus variably reduces the electrical power delivered to the power supply system 100. The power supply system 100 in turn produces a drive signal (e.g., an output current or voltage) that is proportional to the reduced power provided by the dimmer 10 and provides the drive signal to the light source 20. Thus, the light output of the light source 20 may be proportional to the phase angle of the modified sine wave. This results in the dimming of the light output. In some examples, the dimmer 10 may be a TRIAC or ELV dimmer, and may chop the front end or leading edge of the AC input signal. The light source 20 may include one or more light-emitting-diodes (LEDs) In some embodiments, the power supply system 100 is configured to generate a multi-slope target for a power supply to follow, which enables fast transitions in the drive signal of a power supply without overshoot or undershoot, thus significantly reducing or eliminating flickering and flashing during fast transitions from dimmer inputs.

Figure 3A:
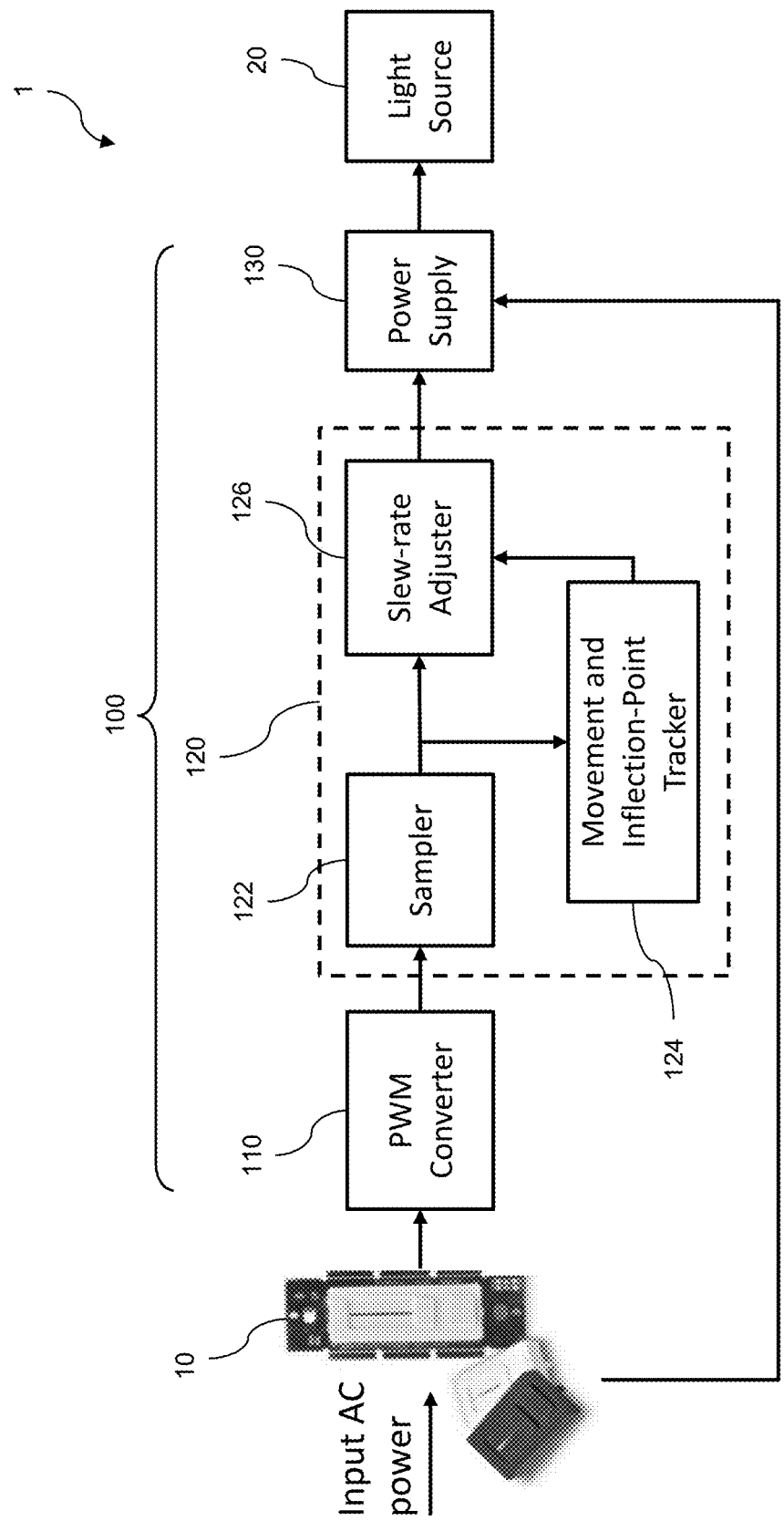
FIG. 3A is block diagram of the power supply system incorporating adaptive slew-rate within the lighting system, according to some embodiments of the present disclosure.

FIG. 3A is block diagram of the power supply system 100 incorporating adaptive slew-rate within the lighting system 1, according to some embodiments of the present disclosure. FIG. 3B illustrates the power supply controller implemented as a processor and memory, according to some embodiments of the present disclosure.

Referring to FIG. 3A, the power supply system 100 includes a PWM converter 110, a power supply controller 120, and a power supply 130.

The PWM converter 110 is configured to convert the modified AC input signal received from the dimmer 10 into a pulse width modulation (PWM) signal for processing by the power supply controller 120. The PWM converter 110 may include one or more comparators that compare the positive and negative swings of the incoming modified AC input signal with one or more set or predefined thresholds to generate a corresponding PWM signal. Thus, the PWM converter 110 maps the dimmed power of the modified AC input signal to pulse width modulations of the PWM signal. In some examples, the duty cycle of the PWM signal represents the dimmer level (i.e., the user setting at the dimmer 10). In some examples, a high value in the PWM signal may be about 3.3 V, which may correspond to a logic high (or a binary '1'), and a low value may be about 0 V, which may correspond to a logic low (or binary '0').

In some embodiments, the power supply controller 120 is configured to measure (e.g., continuously measure) the duty cycle of the PWM signal and to generate a sequence of sample values, each of which corresponds to the dimming level of the dimmer 10 at the corresponding sample time. The power supply controller 120 is configured to monitor the dimmer level (i.e., the dimmer's target setting), determine an appropriate slew-rate based on the dimmer level, and to generate a control signal based on the determined slew-rate, which is provided to the power supply 130.

The power supply 130 then generates a drive signal based on the control signal for powering and controlling the brightness of the light source 20. The drive signal may depend on the type of the one or more LEDs of the light source 20. For example, when the one or more LEDs of the light source 20 are constant current LEDs the drive signal may be a variable voltage signal, and when the light source 20 requires constant voltage, the drive signal may be a variable current signal. The power supply 130 may receive its input power from the modified AC signal from the dimmer 10.

According to some embodiments, the power supply controller 120 includes a sampler 122, the movement and inflection-point tracker 124, and the slew-rate adjuster 126. The sampler 122 measures the duty cycle of each PWM pulse of the received the PWM signal to determine the dimmer level of the dimmer 10 at regular intervals, and generates a plurality of sample values corresponding to the duty cycle of the PWM pulses. Each sample value may a value between 0, which may indicate a 0% duty cycle for a corresponding PWM pulse, and a maximum value, which may indicate a 100% duty cycle for the corresponding PWM pulse. As such, a value of zero may correspond to a minimum brightness setting (e.g., 0% brightness setting) at the dimmer 10, which may indicate, e.g., a user's desire to turn the light source 20 completely off. Further, the maximum value (e.g., 1000 or 10000) may correspond to a maximum brightness setting (e.g., 100% brightness setting) at the dimmer 10, which may indicate, e.g., a user's desire to turn the light source 20 fully on. In other words, each sample value corresponds to a new target setting that a light source 20 should output. The sampling frequency of the sampler 122 may be significantly faster than the speed at which a user can change the dimmer level. For example, the sampling frequency may be about 12 kHz or higher.

In some embodiments, the movement and inflection-point tracker 124 receives the plurality of sample values produced by the sampler 122 and determines the movement direction of the dimmer level as either downward (e.g., when the user lowers the dimmer setting) or upward (e.g., when the use increases the dimmer setting). In some examples, the movement and inflection-point tracker 124 may determine the movement direction by comparing the control signal at any point with the new incoming sample value. If the new/current sample value is less than the control signal at that time, then this indicates that the dimmer level is moving downward, and if the new/current sample value is greater than the control signal at that time, then that indicates that the dimmer level is moving upward. However, embodiments of the present disclosure are not limited thereto, and any suitable approach may be adopted. For example, the movement and inflection-point tracker 124 may determine the movement direction by comparing the current sample value with one or more of the preceding sample values. The movement and inflection-point tracker 124 then compares each sample value of the plurality of sample values with one or more inflection points that may depend on the movement direction of the dimmer level.

According to some embodiments, the slew-rate adjuster 126 in turn sets the slew-rate to one a plurality of slew-rates based on the result of the comparison, and generates the control signal that controls the ramp up/down of the drive signal by the power supply 130. In some embodiments, the control signal is a PWM signal that the slew-rate adjuster 126 generates based on the plurality of sample values and the determined slew-rate. In some examples, based on the determined slew-rate, the slew-rate adjuster 126 maps the sample values to duty cycles of a PWM pulse, which is referred to as the control signal. In some examples, the control signal is filtered to produce a smooth PWM analog signal that can be used by the power supply to control the light intensity of the light source 20. However, embodiments of the present disclosure are not limited to PWM control signals, and any suitable modulation scheme may be utilized to control the power supply 130, so long as the power supply 130 is properly designed for such a modulation scheme. Thus, in some examples, the control signal may be a pulse amplitude modulation signal, a pulse frequency modulation signal, or a variable DC signal (e.g., a DC voltage ranging from 0 V to 10 V).

According to some embodiments, the power supply controller 120 includes any combination of hardware, firmware, or software, employed to process data or digital signals. This may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In the power supply controller 120, each function may be performed either by hardware configured, i.e., hard-wired, to perform that function, or by more general purpose hardware, such as a CPU, configured to execute instructions stored in a non-transitory storage medium. The power supply controller 120 may be fabricated on a single printed wiring board (PWB) or distributed over several interconnected PWBs.

As shown in FIG. 3B, in some embodiments, the power supply controller 120 includes a processor 128 and a memory 129. The processor 128 may include, for example, one or more application specific integrated circuits (ASICs), general purpose or special purpose central processing units (CPUs), digital signal processors (DSPs), graphics processing units (GPUs), and programmable logic devices such as field programmable gate arrays (FPGAs). The memory 129 may have instructions stored thereon that, when executed by the processor 128, cause the processor 128 to perform the operations of the sampler 122, movement and inflection-point tracker 124, and a slew-rate adjuster 126.

Figure 4:
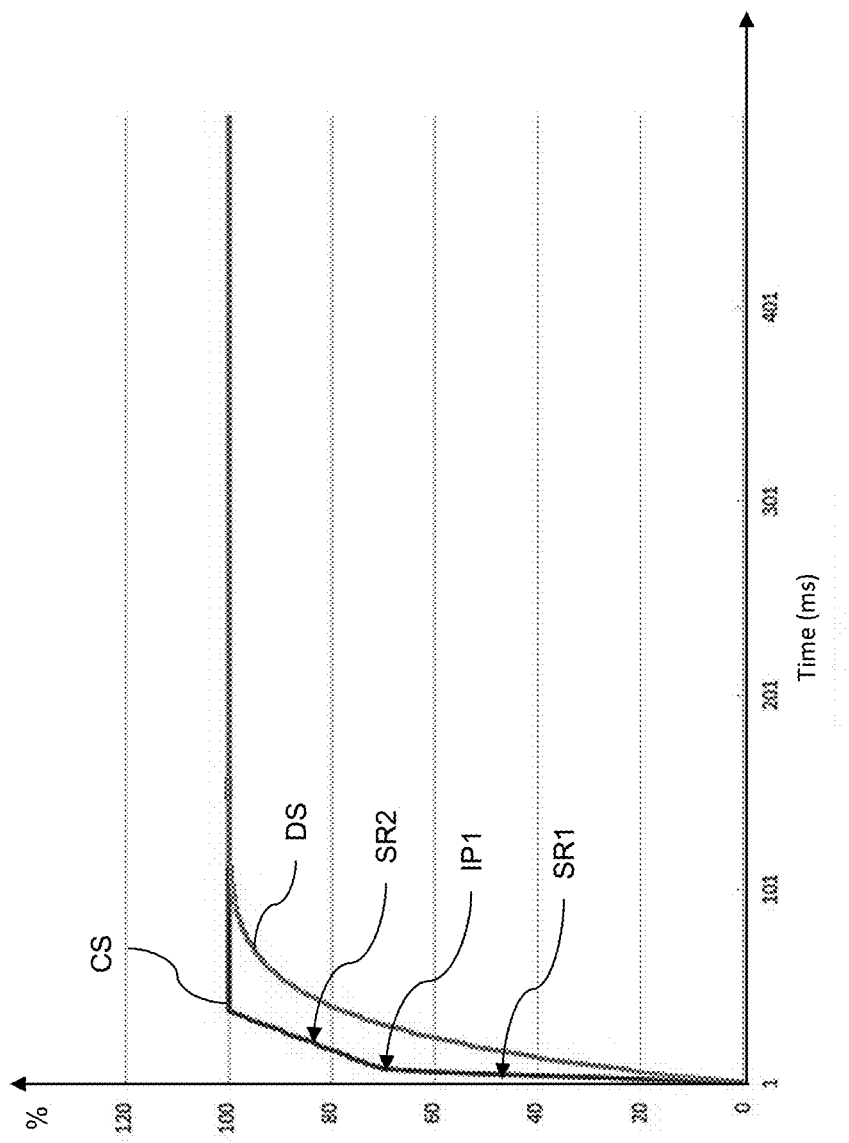
FIG. 4 is a graph illustrating an example of a slew-rate controlled drive signal, according to some example embodiments of the present disclosure.

FIG. 4 is a graph illustrating an example of a slew-rate controlled drive signal, according to some example embodiments of the present disclosure.

In the example of FIG. 4, the one or more inflection points includes a single inflection point IP1 and the plurality of slew-rates include a first slew-rate SR1 and a second slew-rate SR2. Here, while the sample values corresponding to the dimmer level are below the inflection point IP1, the slew-rate adjuster 126 uses the first slew-rate SR1 to generate the control signal CS, and when the sample values exceed the inflection point IP1, the slew-rate adjuster 126 uses the second slew-rate SR2. In this example, the control signal CS which has a single inflection point and two slew-rates causes the power supply 130 to produce a driving signal DS that quickly ramps up from 0% to 100% without exhibiting any overshoot. Here, the slight change in slope timing may not noticeable to the human eye when dimming up or down.

Figure 5A:
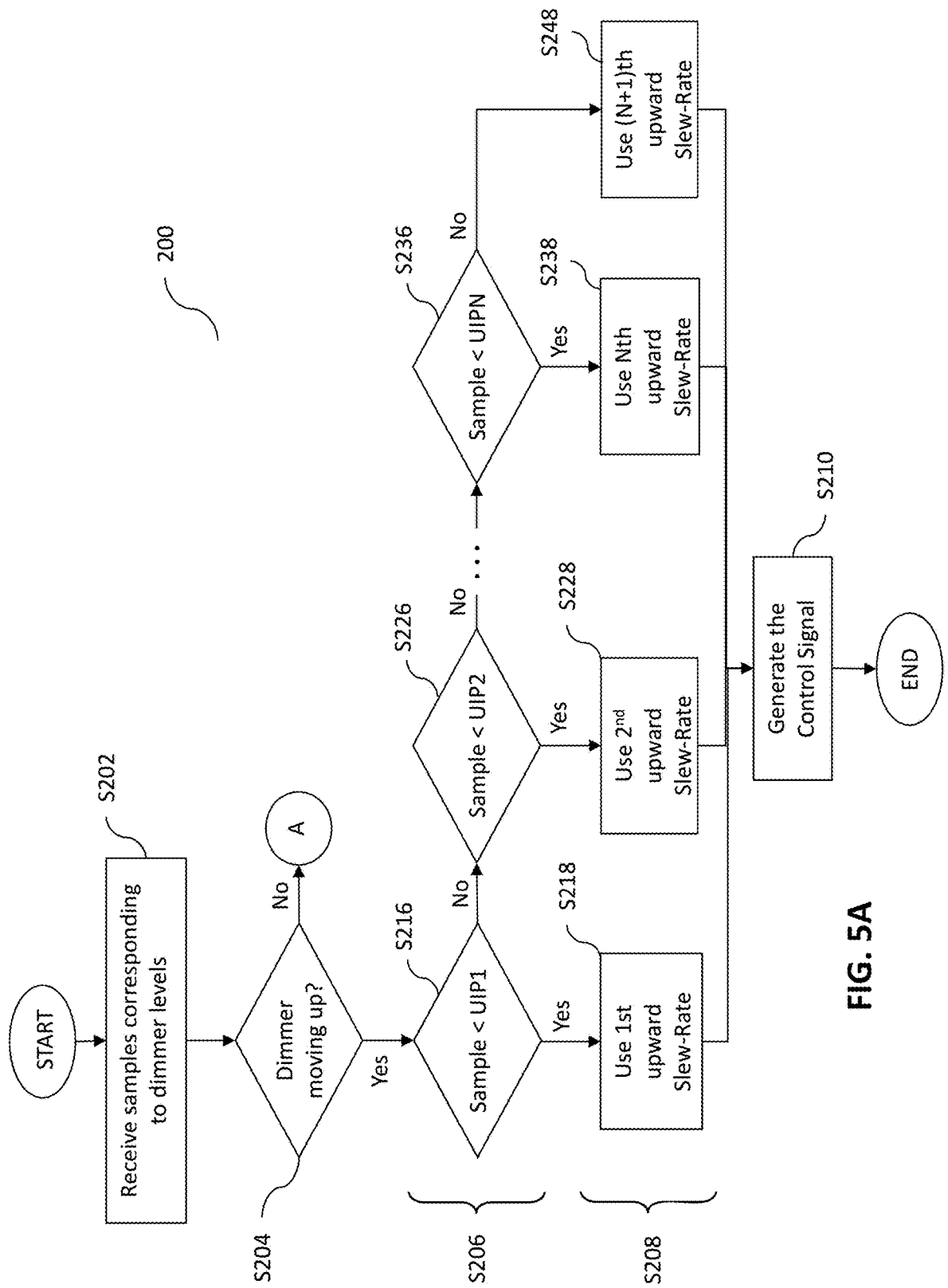
FIGS. 5A-5B illustrate the process of generating a control signal with a slew-rate that tracks the dimmer level, according to some embodiments of the present disclosure.
Figure 5B:
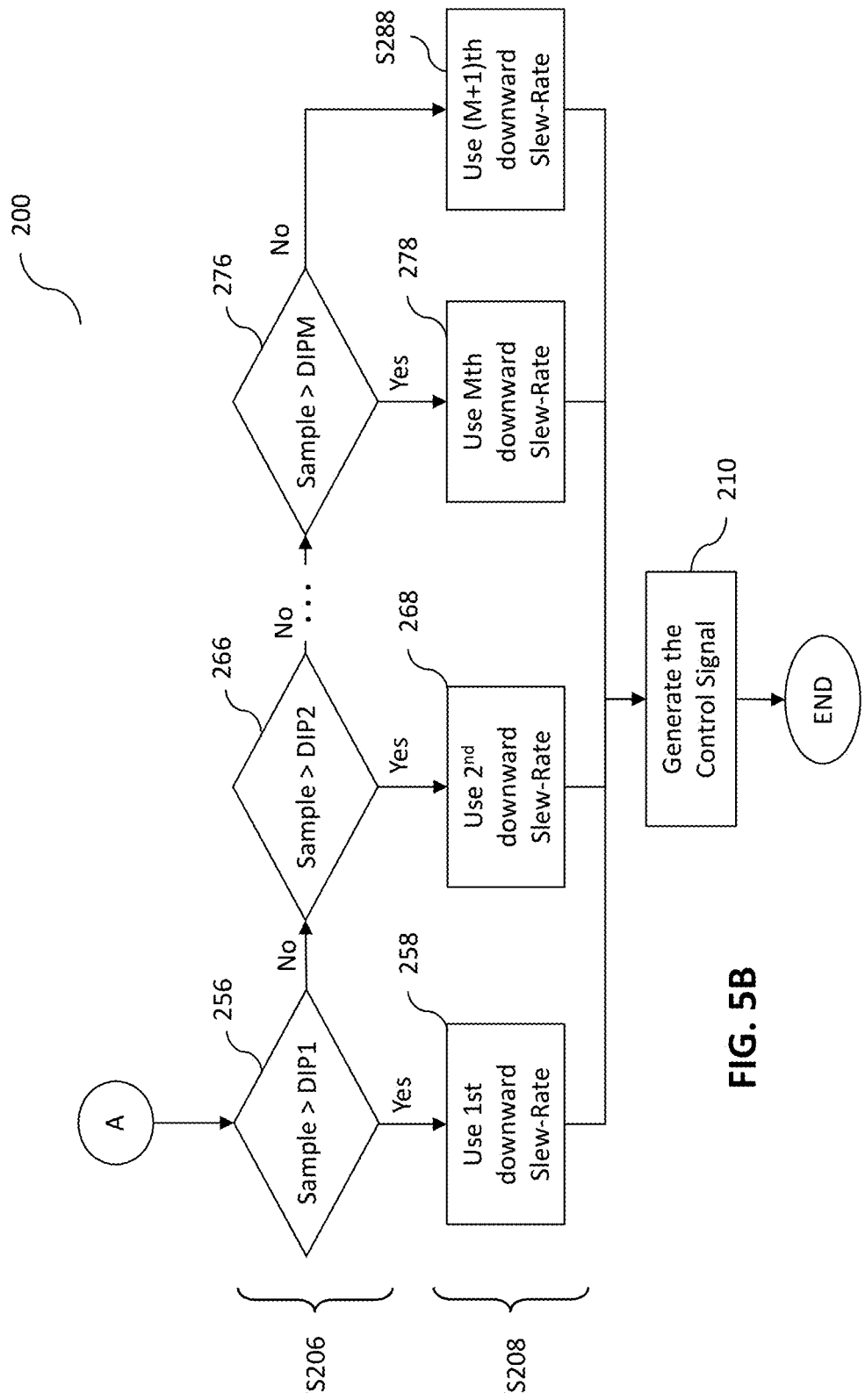

FIGS. 5A-5B illustrate the process 200 of generating a control signal with a slew-rate that tracks the dimmer level, according to some embodiments of the present disclosure.

Referring to FIG. 5A, in some embodiments, the power supply controller 120 (e.g., the movement and inflection point tracker 124 or the processor 128) receive a plurality of sample values corresponding to dimmer levels of the dimmer 10 (S202), and determines the movement direction of the dimmer 10 based on the plurality of sample values as either upward (e.g., increasing) or downward (e.g., decreasing) (S204). The power supply controller 120 (e.g., the movement and inflection point tracker 124 or the processor 128) then compares a sample value (e.g., the current sample value) of the plurality of sample values with one or more inflection points (S206). The one or more inflection points may be associated with a plurality of slew-rates. Here, the comparison is based on the movement direction of the dimmer.

According to some embodiments, the power supply controller 120 (e.g., the slew-rate adjuster 126 or the processor 128) identifies a particular slew-rate among the plurality of slew-rates based on the comparison (S208), and generates a control signal based on the particular slew-rate for transmission to the power supply (S210).

In some embodiments, the set of inflection points used in the comparison (S206) and the set of slew-rates from which the particular slew-rate is selected (S208) depends on the movement direction of the dimmer level. For example, the plurality of inflection points may include first to $N^{th}$ upward inflection points (where N is a positive integer) and first to $M^{th}$ downward inflection points (where M is a positive integer), and the plurality of slew-rates may include first to $(N+1)^{th}$ upward slew-rates and first to $(M+1)^{th}$ downward slew-rates.

When the dimmer level is moving in the upward direction, the power supply controller 120 compares the current sample value with the first to Nth upward inflection points by first comparing the sample value with the first upward inflection point UIP1 (S216). When the power supply controller 120 determines that the sample value is less than the first upward inflection point UIP1, it identifies the first upward slew-rate as the particular slew-rate (S218). When the sample value is greater than or equal to the first upward inflection point UIP1, the power supply controller 120 may identify the second upward slew-rate as the particular slew-rate (S228) when there is no further inflection point to compare with. Otherwise, the power supply controller 120 compares the current sample value with a second upward inflection point UIP2 (S226) and selects the second upward slew-rate (S228) when the sample value is less than second upward inflection point UIP2. When the sample value is greater than or equal to the second upward inflection point UIP2, the power supply controller 120 selects a subsequent slew-rate. The power supply controller 120 may follow the same process in comparing the sample value with subsequent inflection points. Finally, when the sample value is greater than all preceding upward inflection points, the power supply controller 120 compares the sample value with Nth upward inflection point UIPN (S236), which may be the last upward inflection point, and selects the Nth slew-rate (S238) or the (N+1)th slew-rate (S248) based on the sample value being less than or greater than the Nth upward inflection point UIPN, respectively.

Similarly, when the dimmer level is moving in the downward direction, the power supply controller 120 compares the current sample value with the first to Nth downward inflection points by first comparing the sample value with the first downward inflection point DIP1 (S256). When the power supply controller 120 determines that the sample value is less than the first downward inflection point DIP1, it identifies the first downward slew-rate as the particular slew-rate (S258). When the sample value is greater than or equal to the first downward inflection point DIP1, the power supply controller 120 may identify the second downward slew-rate as the particular slew-rate (S268) when there is no further inflection point to compare with. Otherwise, the power supply controller 120 compares the current sample value with a second downward inflection point DIP2 (S266) and selects the second downward slew-rate (S268) when the sample value is less than second downward inflection point DIP2. When the sample value is greater than or equal to the second downward inflection point DIP2, the power supply controller 120 selects a subsequent slew-rate. The power supply controller 120 may follow the same process in comparing the sample value with subsequent inflection points. Finally, when the sample value is greater than all preceding downward inflection points, the power supply controller 120 compares the sample value with Mth downward inflection point DIPM (S276), which may be the last downward inflection point, and selects the Mth slew-rate (S278) or the (M+1)th slew-rate (S288) based on the sample value being less than or greater than the Mth downward inflection point DIPM, respectively.

According to some examples, the number of upward and downward inflection points N and M may be the same. In some examples, for all values of i (i being a positive integer less than or equal to N), the sum of the i-th upward inflection points and the i-th downward inflection points may be a fixed value. The fixed value may be the maximum sample value corresponding to a 100% setting at the dimmer 10. However, embodiments of the present disclosure are not limited thereto, and the number of upward and downward inflection points N and M may be different, depending on the power supply topology and power supply load. For example, for a particular power supply, only downward inflection points may be used (i.e., N=0). Further, the value of each upward inflection point may not be related to the value of any downward inflection point.

Further, in some examples, for all values of i, the i-th downward slew-rate may be the negative of the i-th upward slew-rate. However, embodiments of the present disclosure are not limited thereto, and each of the upward and downward slew-rates may have any suitable value, depending on the power supply topology and LED loading.

Accordingly, as described above, the power supply system with adaptive slew-rate is capable of responding to rapid dimmer setting changes without producing any overshoot or undershoot, which would otherwise result in flickers noticeable by the human eye. Thus, the multi-slope power supply according to some embodiments of the present disclosure can be used for high-performance dimming with Triac dimmers without overshoot or undershoot during fast transitions. Further, the multi-slope power supply can be used with Triac dimmers that provide fast responsiveness with various LED loads, and any current setting.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept". Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "substantially", "about", and similar terms are used as terms of approximation and not as terms of degree, and are intended to account for the inherent variations in measured or calculated values that would be recognized by those of ordinary skill in the art.

As used herein, the terms "use", "using", and "used" may be considered synonymous with the terms "utilize", "utilizing", and "utilized", respectively.

The various components of the power supply system may be formed on one integrated circuit (IC) chip or on separate IC chips. Further, the various components of the power supply system may be implemented on a flexible printed circuit film, a tape carrier package (TCP), a printed circuit board (PCB), or formed on the same substrate. Further, the various components of the power supply system may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

While this disclosure has been described in detail with particular references to illustrative embodiments thereof, the embodiments described herein are not intended to be exhaustive or to limit the scope of the disclosure to the exact forms disclosed. Persons skilled in the art and technology to which this disclosure pertains will appreciate that alterations and changes in the described structures and methods of assembly and operation can be practiced without meaningfully departing from the principles, spirit, and scope of this disclosure, as set forth in the following claims and equivalents thereof.

What is claimed is:

1. A method of controlling a power supply electrically coupled to a dimmer and a light source, the method comprising:
   receiving a plurality of sample values corresponding to dimmer levels;
   comparing a sample value of the plurality of sample values with one or more inflection points, the one or more inflection points being associated with a plurality of slew-rates;
   identifying a particular slew-rate among the plurality of slew-rates based on the comparison; and
   generating a control signal based on the particular slew-rate for transmission to the power supply.

2. The method of claim 1, further comprising:
   determining a movement direction of the dimmer based on the plurality of sample values,
   wherein the comparing the sample value with the one or more inflection points is based on the movement direction of the dimmer.

3. The method of claim 1, wherein the one or more inflection points comprise a first upward inflection point,
   wherein the plurality of slew-rates comprises a first upward slew-rate and a second upward slew-rate,
   wherein the comparing the sample value with the one or more inflection points comprises:
      determining that the sample value is less than the first upward inflection point, and
   wherein the identifying the particular slew-rate among the plurality of slew-rates comprises:
      identifying the first upward slew-rate as the particular slew-rate.

4. The method of claim 3, wherein the comparing the sample value with the one or more inflection points comprises:
   determining that the sample value is greater than or equal to the first upward inflection point, and
   wherein the identifying the particular slew-rate among the plurality of slew-rates comprises:
      identifying the second upward slew-rate as the particular slew-rate.

5. The method of claim 3, wherein the first upward slew-rate is greater than the second upward slew-rate.

6. The method of claim 3, wherein the one or more inflection points further comprise a second upward inflection point greater than the first upward inflection point,
   wherein the plurality of slew-rates further comprises a third upward slew-rate,
   wherein the comparing the sample value with the one or more inflection points comprises:
      determining that the sample value is greater than the second upward inflection point, and
   wherein the identifying the particular slew-rate among the plurality of slew-rates comprises:
      identifying the third upward slew-rate as the particular slew-rate.

7. The method of claim 6, wherein the third upward slew-rate is less than the first and second upward slew-rates.

8. The method of claim 1, wherein the one or more inflection points comprise a first downward inflection point,
   wherein the plurality of slew-rates comprises a first downward slew-rate and a second downward slew-rate,
   wherein the comparing the sample value with the one or more inflection points comprises:
      determining that the sample value is greater than the first downward inflection point, and
   wherein the identifying the particular slew-rate among the plurality of slew-rates comprises:
      identifying the first downward slew-rate as the particular slew-rate.

9. The method of claim 8, wherein the comparing the sample value with the one or more inflection points comprises:
   determining that the sample value is less than or equal to the first downward inflection point, and
   wherein the identifying the particular slew-rate among the plurality of slew-rates comprises:
      identifying the second downward slew-rate as the particular slew-rate.

10. The method of claim 8, wherein the first downward slew-rate is more negative than the second downward slew-rate.

11. The method of claim 8, wherein the one or more inflection points further comprise a second downward inflection point less than the first downward inflection point,
    wherein the plurality of slew-rates further comprises a third downward slew-rate,
    wherein the comparing the sample value with the one or more inflection points comprises:
       determining that the sample value is less than the second downward inflection point, and
    wherein the identifying the particular slew-rate among the plurality of slew-rates comprises:
       identifying the third downward slew-rate as the particular slew-rate.

12. The method of claim 11, wherein the third downward slew-rate is greater than the first and second downward slew-rates.

13. The method of claim 1, wherein the power supply is configured to generate a drive signal having no overshoot or undershoot based on the control signal.

14. The method of claim 1, further comprising:
    receiving a modified AC input signal from the dimmer; and generating the plurality of sample values based on the modified AC input signal, the plurality of sample values comprising the sample value.

15. The method of claim 14, wherein generating the plurality of sample values comprises:
converting the modified AC input signal into a pulse width modulation (PWM) signal; and
sampling the PWM signal to generate the plurality of sample values, each of the plurality of sample values corresponding to a dimming level of the dimmer at a corresponding sample time.

16. A power supply controller coupled to a power supply, the power supply controller comprising:
a processor; and
a processor memory local to the processor, wherein the processor memory has stored thereon instructions that, when executed by the processor, cause the processor to perform:
receiving a plurality of sample values corresponding to dimmer levels;
comparing a sample value of the plurality of sample values with one or more inflection points, the one or more inflection points being associated with a plurality of slew-rates;
identifying a particular slew-rate among the plurality of slew-rates based on the comparison; and
generating a control signal based on the particular slew-rate for transmission to the power supply.

17. The power supply controller of claim 16, wherein, when executed by the processor, the instructions further cause the processor to perform:
determining a movement direction of the dimmer levels based on the plurality of sample values,
wherein the comparing the sample value with the one or more inflection points is based on the movement direction of the dimmer levels.

18. The power supply controller of claim 16, wherein the one or more inflection points comprise a first upward inflection point,
wherein the plurality of slew-rates comprises a first upward slew-rate and a second upward slew-rate,
wherein the comparing the sample value with the one or more inflection points comprises:
determining that the sample value is less than the first upward inflection point, and
wherein the identifying the particular slew-rate among the plurality of slew-rates comprises:
identifying the first upward slew-rate as the particular slew-rate.

19. The power supply controller of claim 18, wherein the first upward slew-rate is greater than the second upward slew-rate.

20. The power supply controller of claim 16, wherein the one or more inflection points comprise a first downward inflection point,
wherein the plurality of slew-rates comprises a first downward slew-rate and a second downward slew-rate,
wherein the comparing the sample value with the one or more inflection points comprises:
determining that the sample value is greater than the first downward inflection point, and
wherein the identifying the particular slew-rate among the plurality of slew-rates comprises:
identifying the first downward slew-rate as the particular slew-rate.

21. The power supply controller of claim 20, wherein the first downward slew-rate is more negative than the second downward slew-rate.

* * * * *